United States Patent [19]
Ohashi et al.

[11] Patent Number: 5,306,572
[45] Date of Patent: Apr. 26, 1994

[54] EL ELEMENT COMPRISING ORGANIC THIN FILM

[75] Inventors: Yutaka Ohashi; Nobuhiro Fukuda; Atsuhiko Nitta; Sadao Kobayashi, all of Kanagawa, Japan

[73] Assignee: Mitsui Toatsu Chemicals, Inc., Tokyo, Japan

[21] Appl. No.: 993,882

[22] Filed: Dec. 23, 1992

[30] Foreign Application Priority Data

Dec. 24, 1991 [JP] Japan .................. 3-340768
Apr. 24, 1992 [JP] Japan .................. 4-107011

[51] Int. Cl.$^5$ ............................... B32B 9/00
[52] U.S. Cl. .................... 428/690; 428/917; 313/503; 313/504
[58] Field of Search .......... 252/301.16; 428/917, 428/690, 457; 313/304–306, 502, 503, 504, 505, 506

[56] References Cited

U.S. PATENT DOCUMENTS

| | | | |
|---|---|---|---|
| 4,356,429 | 10/1982 | Tang .................. | 313/503 |
| 4,482,841 | 11/1984 | Tiku .................. | 313/503 |
| 4,539,507 | 9/1985 | VanSlyke et al. ......... | 313/504 |
| 4,595,599 | 6/1986 | Brown .................. | 252/301.16 |
| 4,720,432 | 1/1988 | VanSlyke et al. ......... | 428/457 |
| 4,733,128 | 3/1988 | Tohda .................. | 313/503 |
| 4,769,292 | 9/1988 | Tang et al. ............. | 428/690 |
| 4,885,211 | 12/1989 | Tang et al. ............. | 428/457 |
| 5,104,740 | 4/1992 | Shinkai .................. | 313/504 |
| 5,130,603 | 7/1992 | Tonkalin et al. ......... | 313/504 |

FOREIGN PATENT DOCUMENTS

2438952  9/1980  France .
2-196475  8/1990  Japan .
2-207488  8/1990  Japan .

*Primary Examiner*—Patrick J. Ryan
*Assistant Examiner*—Patrick Jewik
*Attorney, Agent, or Firm*—Millen, White, Zelano, & Branigan

[57] ABSTRACT

Herein disclosed are organic thin film EL element having layer structures each of which comprises at least one organic thin film sandwiched between two electrodes, at least one of which is a metal thin film or one of which is a metal thin film and the other of which is a transparent conductive inorganic thin film, and an optional thin film of an inorganic semiconductor positioned between the transparent conductive thin film and the organic thin film, wherein an interfacial layer is fromed between the organic thin film and the metal thin film adjacent to the organic thin film by treating the organic thin film and/or the metal thin film with an organic phosphorus atom-containing compound; and-/or wherein an interfacial layer is formed between the organic thin film and the inorganic thin film adjacent to the inorganic thin film by treating the organic thin film and/or the inorganic thin film with a silane-coupling agent. In the EL element, the metal thin film formed on the organic thin film has low unevenness, the metal thin film is strongly adhered to the organic thin film.

18 Claims, 3 Drawing Sheets

F I G. 5
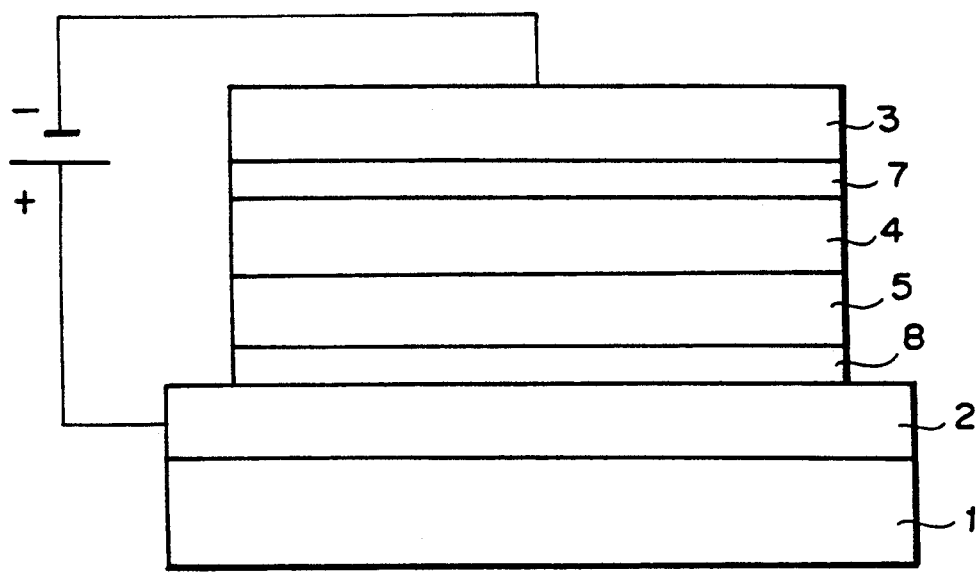
F I G. 6
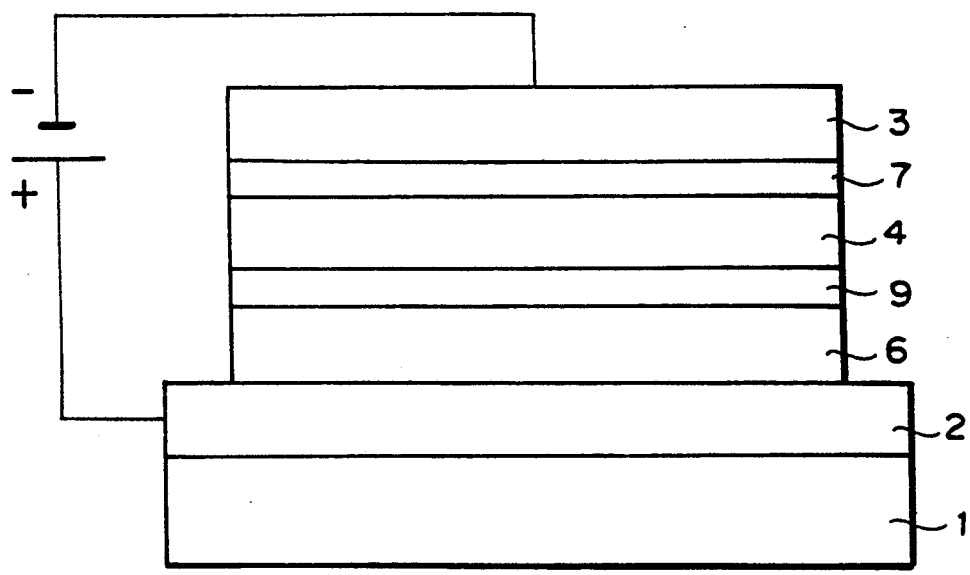

EL ELEMENT COMPRISING ORGANIC THIN FILM

BACKGROUND OF THE INVENTION 1. (Field of the Invention)

The present invention relates to an element for display device and more specifically to a high quality EL element comprising an organic thin film.

2. (Description of the Prior Art)

There has increasingly been desired for the development of high quality parts for displaying information along with the recent remarkable development of the information-oriented society. Electroluminescence elements (EL elements) which make use of the phenomenon of electroluminescence (EL) have been attracting much attention from the industrial standpoint because of their excellent properties such as visibility.

There have been developed, for instance, so-called intrinsic EL elements such as elements comprising organic substances in which inorganic fine particles are dispersed and elements in which inorganic thin films of, for instance, ZnS are sandwiched between insulating thin films and they have already been put into practical use. However, these elements suffer from various problems. For instance, they require high driving voltages and it is difficult to obtain elements capable of emitting lights of certain colors such as lights of blue color. On the other hand, there have also been known carrier injection EL elements in addition to these intrinsic EL elements. The carrier injection type EL element comprises electrons and holes injected in a p-n junction of, for instance, a semiconductor and emits light through recombination of the electrons and holes. The element is, for instance, characterized in that it can be operated by a direct current at a low driving voltage and that it can convert a current into a light in a high efficiency. In these elements, inorganic crystalline semiconductors such as GaP are mainly used. However, these elements likewise suffer from various problems. For instance, colors of emitted lights are limited to specific ones and it is difficult to obtain any element having a large area. There has accordingly been desired for the development of a technique for producing elements having a low driving voltage and capable of emitting light of various colors, which permits production of an element having a large area.

Recently a novel carrier injection type EL element which makes use of an organic thin film has been reported (see C.W. Tang, Appl. Phys. Lett., 1987, 51(12), p. 193) and has been attracted much attention since it is anticipated that colors of emitted lights can freely be selected through appropriate selection of organic compounds, that such element can be operated at a low driving voltage and that an element having a large area can easily be prepared by the application of method for forming thin films such as vapor-deposition and coating methods. Such EL elements produced from organic thin films are described in, for instance, U.S. Pat. Nos. 4,356,429; 4,539,507; 4,720,432; 4,769,292 and 4,885,211. In addition, the inventors of this invention developed an EL element comprising laminated organic and inorganic thin films (see Japanese Unexamined Patent Publication (hereinafter referred to as "J.P. KOKAI") Nos. Hei 2-196475 and Hei 2-207488). However, it has been reported that these EL elements comprising organic thin films suffer from so-called deterioration or reduction in luminance of emitted lights when they are operated over a long time period.

The foregoing element which makes use of the organic thin film has a layer structure comprising a hole-transport organic thin film and a emitted organic thin film formed between two electrodes. The first electrode mainly comprises ITO, while the second electrode comprises a metal thin film of, for instance, Mg. On the other hand, the element which comprises laminated organic and inorganic thin films has a layer structure comprising a hole-transport inorganic thin film and a luminous organic thin film formed between two electrodes. In this case, the first electrode likewise mainly comprises ITO, while the second electrode comprises a metal thin film of, for instance, Mg. The following deterioration phenomena are, for instance, observed in these elements: (i) if they are allowed to stand in the air, the driving voltage thereof increases and as a result, the elements are broken down; (ii) there are Observed an increase of the driving voltage and formation of dark spots which do not have capability of emission of light during the continuous operation thereof; and (iii) when increasing the current load for operation, the luminance thereof is substantially reduced due to generation of heat.

SUMMARY OF THE INVENTION

The inventors of this invention have variously investigated causes of the foregoing deterioration and have found that the deterioration is caused by interfaces formed between organic and metal thin films and those formed between organic and inorganic thin films (transparent conductive inorganic thin film such as an ITO thin film and a hole-transport inorganic thin film). More specifically, in an EL element which makes use of organic thin films, the inorganic thin film of ITO comes in contact with the hole-transport organic thin film to form an interface and a metal thin film comes in contact with a luminous organic thin film to form an interface. If a layer of a material is put on the top of a layer of a different material as in the above cases, these thin films are made quite unstable which causes serious deterioration of these elements. Therefore, the interfaces between thin films of different substances in contact with one another must first be improved in order to eliminate the deterioration.

Accordingly, an object of the present invention is to provide an EL element wherein a metal thin film formed on an organic thin film has low unevenness and the metal thin film is strongly adhered to the organic thin film thereby giving a low driving voltage, maintaining initial driving voltage and uniformity of luminance even in the case of long time operation.

Another object of the present invention is to provide an EL element having improved light-emission efficiency.

Still another object of the present invention is to provide an EL element having a large scale area.

According to a first aspect of the present invention, there is provided an organic thin film EL element having a layer structure which comprises at least one organic thin film sandwiched between two electrodes, at least one of which is a metal thin film, wherein an interfacial layer is formed between the organic thin film and the metal thin film adjacent to the organic thin film by treating the organic thin film and/or the metal thin film with an organic phosphorus atom-containing compound.

According to a second aspect of the present invention, there is provided an organic thin film EL element having a layer structure which comprises at least one organic thin film sandwiched between two electrodes, one of which is a metal thin film and the other of which is a transparent conductive inorganic thin film, and an optional thin film of an inorganic semiconductor positioned between the transparent conductive thin film and the organic thin film, wherein an interfacial layer is formed between the organic thin film and the inorganic thin film adjacent to the organic thin film by treating the organic thin film and/or the inorganic thin film with a silane-coupling agent.

According to a third aspect of the present invention, there is provided an organic thin film EL element having a layer structure which comprises at least one organic thin film sandwiched between two electrodes, one of which is a metal thin film and the other of which is a transparent conductive inorganic thin film, and an optional thin film of an inorganic semiconductor positioned between the transparent conductive thin film and the organic thin film, wherein a first interfacial layer is formed between the organic thin film an the metal thin film adjacent to the organic thin film by treating the organic thin film and/or the metal thin film with an organic phosphorus atom-containing compound and a second interfacial layer is formed between the organic thin film and the inorganic thin film adjacent to the organic thin film by treating the organic thin film and/or the inorganic thin film with a silane-coupling agent.

BRIEF DESCRIPTION OF THE DRAWINGS

FIGS. 5 and 6 are schematic diagrams showing embodiments of the organic thin film EL element according to the present invention wherein a first interfacial layer is formed between the organic thin film and the metal thin film adjacent to the organic thin film by treating the organic thin film and/or the metal thin film with an organic phosphorus atom-containing compound and a second interfacial layer is formed between the organic thin film and the inorganic thin film adjacent to the organic thin film by treating the organic thin film and/or the inorganic thin film with a silane-coupling agent.

DESCRIPTION OF THE PREFERRED EMBODIMENTS

Figure 1:
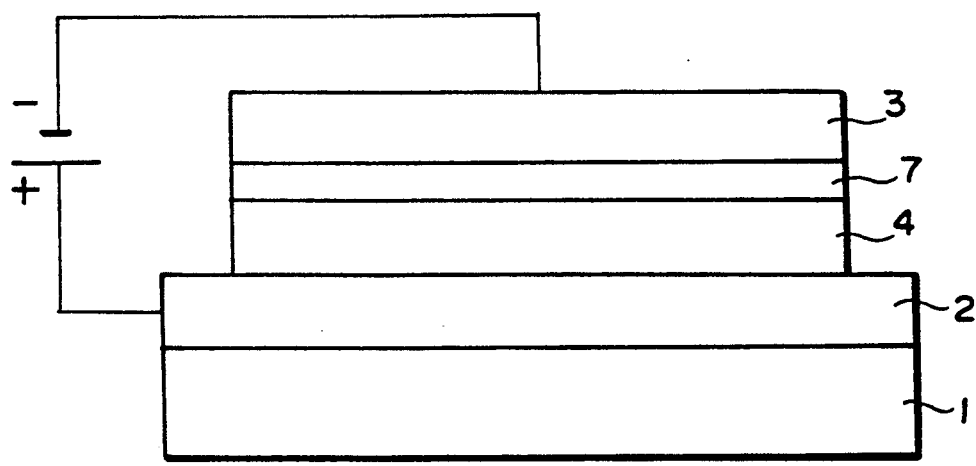
FIGS. 1 and 2 are schematic diagrams illustrating embodiments of the organic thin film EL element according to the present invention wherein an interfacial layer is formed between an organic thin film and a metal thin film adjacent to the organic thin film by treating the organic thin film and/or the metal thin film with an organic phosphorus atom-containing compound.

The organic thin film used in the organic thin film EL element of the present invention may be any organic thin film used in the conventional organic thin film EL elements. Examples thereof include organic thin films composed of fluorescent organic compounds; organic thin films composed of mixtures comprising fluorescent organic compounds and hole-and/or electron-transport organic compounds; laminated organic thin films composed of luminous organic thin films and hole-transport organic thin films; and laminated organic thin films composed of luminous organic thin films, hole-transport organic thin films and electron-transport organic thin films.

Preferred examples of the fluorescent organic compounds are tetravinylpyrazine derivatives such as 2,3,5,6-tetrakis(2-(4-methylphenyl)vinyl)pyrazine; metal complexes such as tris-(8-hydroxyquinolinol)aluminum; pyrazine derivatives; styrylanthracene derivatives; styryl derivatives; coumarin derivatives; and oxadiazole derivatives.

Preferred examples of electron-transport organic compounds are metal complexes such as tris-(8-hydroxyquinolinol)aluminum; and oxadiazole derivatives such as 2,5-bis(4'-diethylamino-phenyl)-1,2,4-oxadiazole.

Preferred examples of hole-transport organic compounds include diamine compounds such as N,N'-diphenyl-N,N'-bis-(3-methylphenyl)-1,1'-diphenyl-4,4'-diamine; phthalocyanine compounds such as copper phthalocyanine; and polymeric compounds such as polyvinyl carbazole and polymethylphenylsilane.

According to the present invention, these compounds are formed into organic thin films. These thin films may be formed by, for instance, vacuum vapor-deposition, sublimation and coating techniques. The thickness of these organic thin films in general range from 10 to 3,000 Å.

In the organic thin film EL element of the present invention, at least one of electrodes which sandwich at least one organic thin film comprises a metal film. More specifically, one of these electrodes is a metal film and the other is a transparent conductive inorganic thin film, a light-transmitting mesh-like metal thin film or a metal thin film having slits or apertures for transmitting lights. Preferred are, for instance, combinations of metal thin films and transparent conductive inorganic thin films.

Examples of the transparent conductive inorganic thin films are those formed from metal oxides, metal silicides and laminated thin films thereof. More preferred are transparent conductive films of tin oxide ($SnO_2$), indium oxide ($In_2O_3$), indium oxide-tin oxide (ITO) and zinc oxide (ZnO). The thickness of the transparent conductive films is not restricted to a specific range, but in general ranges from about 10 to 5,000 Å. The transparent conductive inorganic thin film may of course have a thickness beyond the range defined above. The transparent conductive inorganic thin film may be formed by thin film-forming methods appropriately selected from, for instance, vapor-deposition and sputtering methods.

As the metal thin film, there may be used, for instance, thin films of metals and alloys and laminated thin films thereof. Preferred are those formed from Group II metals such as Mg; Group III metals such as Al; alloys of Group II-I metals such as Mg-Ag; and alloys of Group II-III metals such as Mg-In. The thickness of the metal films is not restricted to a specific range, but in general ranges from about 10 to 5,000Å. The metal thin film may be formed by thin film-forming methods appropriately selected from, for instance, vapor-deposition and sputtering methods.

The inorganic semiconductor thin film used in the EL element of the present invention is not restricted to specific ones, but preferred are amorphous and microcrystalline semiconductor thin films, with Si materials and SiC materials such as hydrogenated amorphous Si, hydrogenated amorphous SiC, hydrogenated microcrystalline Si and hydrogenated microcrystalline SiC being more preferred. Moreover, the hole conductivity and electron conductivity of this thin film can, of course, be controlled by the modification of the composition thereof and doping or by forming the film into a laminated structure. The thickness of the semiconductor thin film is not restricted to a specific range, but in general ranges from about 10 to 3,000Å. The inorganic semiconductor thin film may of course have a thickness beyond the range defined above. The inorganic semiconductor thin film may be formed by various thin film-forming methods appropriately selected from, for instance, photo CVD, plasma CVD, thermal CVD, MBE, vapor-deposition and sputtering methods.

In the organic thin film EL element according to the present invention, an interfacial layer is formed between the organic thin film and the metal thin film adjacent to the organic thin film by treating the organic thin film and/or the metal thin film with an organic phosphorus atom-containing compound. Preferred organic phosphorus atom-containing compounds are, for instance, phosphoric acid esters, acidic phosphoric acid esters, phosphorous acid esters and organic phosphines.

Specific examples of phosphoric acid esters are trimethyl phosphate, triethyl phosphate, tributyl phosphate, triphenyl phosphate, tricresyl phosphate and cresyl diphenyl phosphate.

Specific examples of acidic phosphoric acid esters are ethyl acid phosphate and isopropyl acid phosphate.

Specific examples of phosphorous acid esters are tertiary phosphites such as triphenyl phosphite, tris(-nonylphenyl) phosphite, triisooctyl phosphite, phenyl diisodecyl phosphite, triisodecyl phosphite, trisstearyl phosphite, trioleyl phosphite and trilauryl trithiophosphite; and secondary phosphites such as di-2-ethylhexyl hydrogen phosphite, dilauryl hydrogen phosphite and dioleyl hydrogen phosphite.

Organic phosphines usable in the invention are, for instance, triphenyl phosphine.

In the organic thin film EL element of the invention, the interfacial layer can be formed from an organic phosphorus atom-containing compound, after the formation of an organic thin film, by treating the surface of the organic thin film with an organic phosphorus atom-containing compound and then forming a metal thin film. If liquid or gaseous organic phosphorus atom-containing compound is used, the interfacial layer of the phosphorus atom-containing compound is preferably formed by exposing the surface to the gas or vapor of the compound, applying the liquid compound onto the surface or dipping the surface in the liquid. On the other hand, if a solid phosphorus atom-containing compound is used, the interfacial layer is formed by dissolving the compound in a proper solvent and then coating the surface with the solution or by vapor-deposition of the compound. The interfacial layer is particularly preferably formed by exposing the surface with the vapor of the compound. The thickness of the interfacial layer formed on the organic thin film preferably ranges from the thickness of the monomolecular layer thereof to about 100Å. In this respect, the formation of the interfacial layer of the compound can be confirmed by observing the color change of the light reflected by the surface since the presence thereof causes a color change of the reflected light. It would be assumed that the interfacial layer of the organic phosphorus atom-containing compound thus formed is necessarily heated during the subsequent formation of the metal thin film to thus undergo a reaction in the contact interface and to thus form a certain kind of linkage.

Moreover, in the EL element of the invention, an interfacial layer is formed through a treatment with a silane-coupling agent between the organic thin film and the inorganic thin film (or the transparent conductive inorganic or inorganic semiconductor thin film) adjacent to the organic thin film. The silane-coupling agent usable in the invention is not restricted to a specific one so far as it is a compound represented by the following general formula (1):

$$X\text{-}Si(OR)_3 \qquad (1)$$

wherein X is a functional group capable of reacting with the organic substance such as an amino, vinyl, epoxy or mercapto group or a halogen atom; and R is a hydrolyzable group such as a methyl or ethyl group.

Preferred examples thereof include vinylsilanes such as vinyltrimethoxysilane, acrylsilanes such as γ-methacryloxypropyltrimethoxysilane, epoxysilanes such as γ-glycidoxypropylmethylsilane and aminosilanes such as N-β-(aminoethyl)-γ-aminopropyltrimethoxysilane.

The interfacial layer formed through the treatment with these silane-coupling agents is one formed by fixing one or more of the silane-coupling agents represented by the general formula (1) on the surface of the inorganic thin film. The interfacial layer may be formed by any known method, but it is preferred to form the layer by applying the silane-coupling agent onto the surface of the inorganic thin film through a spin-coating or dipping method, reacting the agent with the inorganic thin film through application of heat or irradiation with, for instance, UV light rays to fix the agent to the surface. In short, the kinds of silane-coupling agents and the treating method is selected so that a uniform surface layer free of pinholes can be formed and good contact between the inorganic and organic thin films can be ensured. The surface of the inorganic thin film may be treated by a heat or plasma treatment prior to the treatment with the silane-coupling agent to thus improve the adhesion between these thin films.

The thickness of the interfacial layer is not limited to a specific range, but in general ranges from the thickness of the monomolecular layer of the coupling agent to about 100Å. The interfacial layer may of course have a thickness beyond the range defined above. After all, it is important to form a layer bonded to the inorganic thin film through linkages formed between the Si-containing organic compound and the inorganic thin film.

Specific structures of the organic thin film EL element according to the present invention will be explained in more detail below with reference to the accompanying drawings.

Figure 2:
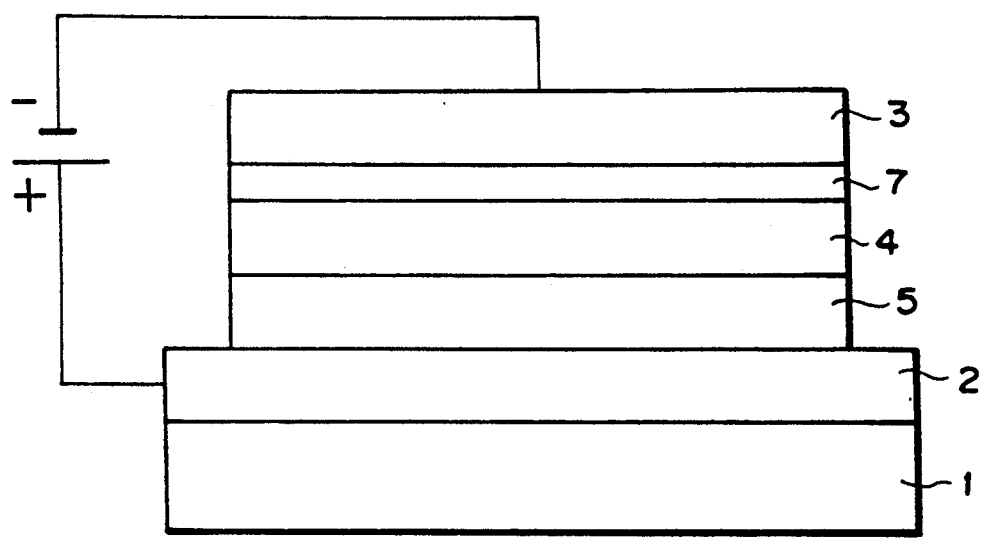

FIG. 1 shows an embodiment of the EL element of the invention which comprises a transparent substrate 1 such as a lass plate provided thereon with, in order, a transparent conductive inorganic thin film 2 (electrode), a luminous organic thin film 4, an interfacial layer 7 derived from an organic phopsphorus atom-containing compound and a metal thin film 3 (electrode). FIG. 2 shows another embodiment of the EL element which comprises a transparent substrate 1 such as a lass plate provided thereon with, in order, a transparent conductive inorganic thin film 2 (electrode), a hole-transport organic thin film 5, a luminous organic thin film 4, an interfacial layer 7 derived from an organic phopsphorus atom-containing compound and a metal thin film 3 (electrode). The structures of these EL elements are not restricted to specific ones. In these elements, it is important that the interfacial layer 7 derived from an organic phopsphorus atom-containing compound is formed between the organic thin film 4 and the metal thin film 3.

Figure 3:
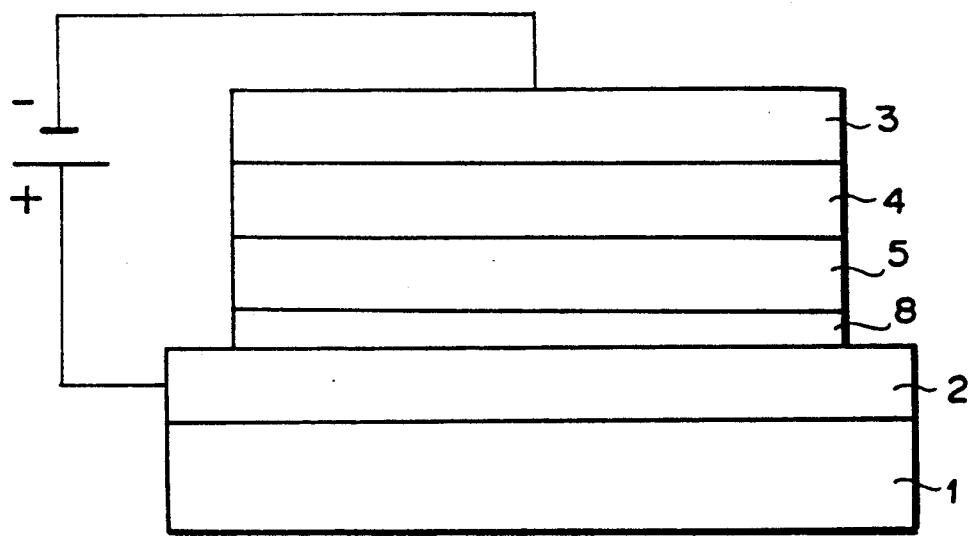
FIGS. 3 and 4 are schematic diagrams illustrating embodiments of the organic thin film EL element according to the present invention wherein an interfacial layer is formed between an organic thin film and an inorganic thin film adjacent to the organic thin film by treating the organic thin film and/or the inorganic thin film with a silane-coupling agent.
Figure 4:
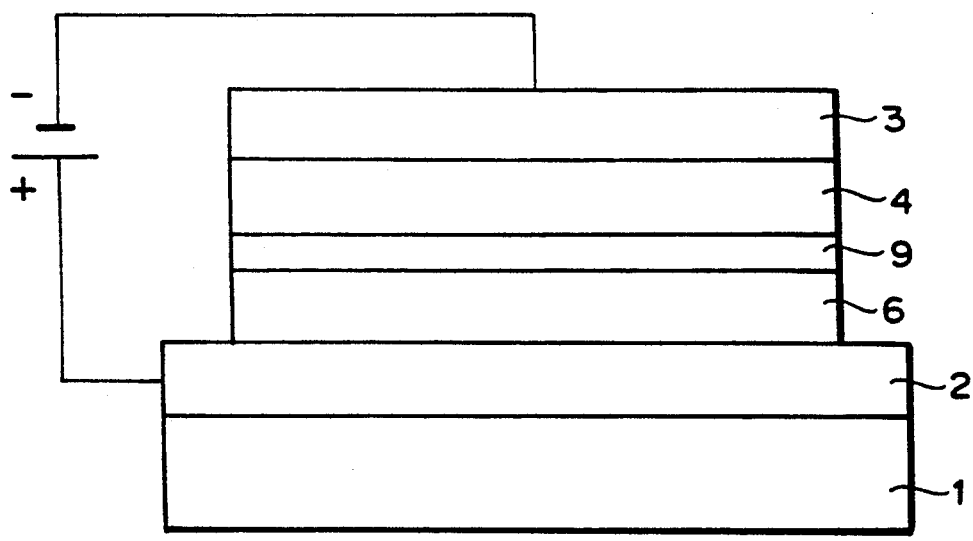

FIG. 3 shows a further embodiment of the EL element which comprises a transparent substrate 1 such as a glass plate provided thereon with, in order, a transparent conductive inorganic thin film 2 (electrode), an interfacial layer 8 formed by treating the surface of the transparent conductive inorganic thin film 2 with a silane-coupling agent, a hole-transport organic thin film 5, a luminous organic thin film 4 and a metal thin film 3 (electrode). FIG. 4 shows a still further embodiment of the EL element which comprises a transparent substrate 1 such as a glass plate provided thereon with, in order, a transparent conductive inorganic thin film 2 (electrode), an inorganic semiconductor thin film 6, an interfacial layer 9 formed by treating the surface of the inorganic semiconductor thin film 6 with a silane-coupling agent, a luminous organic thin film 4 and a metal thin film 3 (electrode). The structures of these EL elements are not restricted to specific ones. In these elements, it is important that the interfacial layer 8 formed by treating the surface of the transparent conductive inorganic thin film 2 with a silane-coupling agent is positioned between the organic thin film 5 and the inorganic thin film 2 or that the interfacial layer 9 formed by treating the surface of the inorganic semiconductor thin film 6 with a silane-coupling agent is positioned between the organic thin film 4 and the inorganic semiconductor thin film 6.

Specific examples of more preferred structures of the organic thin film EL element of the present invention are shown in FIGS. 5 and 6. FIG. 5 shows a preferred embodiment of the EL element which comprises a transparent substrate 1 such as a glass plate provided thereon with, in order, a transparent conductive inorganic thin film 2 (electrode), an interfacial layer 8 formed by treating the surface of the transparent conductive inorganic thin film 2 with a silane-coupling agent, a hole-transport organic thin film 5, a luminous organic thin film 4, an interfacial layer 7 derived from an organic phopsphorus atom-containing compound and a metal thin film 3 (electrode). On the other hand, FIG. 6 shows another preferred embodiment of the EL element which comprises a transparent substrate 1 such as a glass plate provided thereon with, in order, a transparent conductive inorganic thin film 2 (electrode), an inorganic semiconductor thin film 6, an interfacial layer 9 formed by treating the surface of the inorganic semiconductor thin film 6 with a silane-coupling agent, a luminous organic thin film 4, an interfacial layer 7 derived from an organic phopsphorus atom-containing compound and a metal thin film 3 (electrode). The structures of these EL elements are not restricted to specific ones. In these elements, it is important that the interfacial layer 7 derived from an organic phopsphorus atom-containing compound is arranged between the organic thin film 4 and the metal thin film 3 and the interfacial layer 8 formed by treating the surface of the transparent conductive inorganic thin film 2 with a silane-coupling agent is positioned between the organic thin film 5 and the inorganic thin film 2, or that the interfacial layer 7 derived from an organic phopsphorus atom-containing compound is formed between the organic thin film 4 and the metal thin film 3 and the interfacial layer 9 formed by treating the surface of the inorganic semiconductor thin film 6 with a silane-coupling agent is positioned between the organic thin film 4 and the inorganic semiconductor thin film 6. These structures comprising these two interfacial layers can ensure further improvement of the various properties of these EL elements.

The method for producing the organic thin film EL element according to the present invention and the method for evaluating the properties of the EL element will be detailed below.

First, the method for producing the EL element comprising a laminated organic thin film of the invention will be explained.

A thin film of indium oxide tin oxide (ITO) is formed on a glass substrate by the electron beam vacuum vapor-deposition technique. Then a silane-coupling agent is dissolved in an organic solvent and applied onto the surface of the ITO film by the spin coating method. The glass substrate is put on a hot plate to dry the coated layer and to thus give, on the ITO layer, a layer formed through the treatment with the silane-coupling agent. The composition and structure of this layer can be evaluated by the elemental analysis and the FT-IR method respectively. Moreover, the wettability of the surface can be evaluated by determining the contact angle thereof with respect to a water drop.

The substrate is placed in an apparatus for vacuum vapor-deposition to form an organic vapor-deposited film. The deposition by the vacuum vapor-deposition method comprises introducing a hole-transport material, a luminous material and an electron-transport material (several grams each) into quartz boats (1 cc volume) wrapped in a heater coil ($1\phi$; numbers of turns=5), heating one of the materials by passing an electric current (about 8 A) through the heater coil in vacuo to thus form a thin film of the aimed material. On the other hand, if a plurality of thin films having different properties are laminated, an electric current is successively or intermittently passed through the heater coils wrapping the quartz boats in a predetermined order to deposit these materials in order. In addition, if a thin film of a mixture of different materials is formed, an electric current is simultaneously passed through a plurality of quartz boats to co-deposit the materials while the mixing ratio of these materials are controlled by monitoring the vapor-deposition rates thereof. The degree of vacuum at this stage is in the order of $5 \times 10^{-5}$ (Torr). Thereafter, the glass substrate provided thereon with the organic thin film is suspended over a solution of an organic phosphorus atom-containing compound contained in a beaker while preventing any direct contact between the organic thin film and the solution. Then the phosphorus atom-containing compound is vaporized by application of heat to the beaker to form a layer thereof on the organic thin film. The formation of the layer is carried out while observing the color of the light reflected by the organic thin film. The composition and the structure of this layer can be evaluated by the elementary analysis and the FT-IR method respectively. Then a vapor-deposited film of a metal is partially formed on the layer, which is formed by the treatment with the phosphorus atom-containing compound, by placing the substrate in another vacuum vapor-deposition apparatus and depositing a metal, through a metal mask, by heating a metal source present in a tungsten boat at a degree of vacuum of $2 \times 10^{-6}$ (Torr).

The vapor-deposited substrate is withdrawn from the apparatus in the air, the positive terminal of a DC power source is connected to the ITO portion while the negative terminal thereof is communicated to the metal vapor-deposited film, then the voltage of the DC power source is gradually increased to determine the voltage, current and luminance of the emitted light by measuring instruments.

Then the method for producing an EL element which comprises an inorganic semiconductor thin film and a laminated organic thin film will be detailed below.

A thin film of indium oxide tin oxide (ITO) is formed on a glass substrate by the electron beam vacuum vapor-deposition technique. Then the substrate is placed in a plasma CVD apparatus and heated in a vacuum. When the temperature of the substrate reaches a predetermined level, a gas mixture mainly comprising monosilane gas is introduced into the apparatus to a predetermined pressure. After the pressure of the gas mixture reaches the desired level, the gas introduced is decomposed by inducing a discharge through the application of a high frequency voltage between electrodes of the apparatus to thus form an inorganic semiconductor thin film on the ITO thin film. Then a silane-coupling agent is dissolved in an organic solvent and applied onto the inorganic semiconductor thin film by the spin coating technique. The substrate is dried by putting it on a hot plate to thus form a treated layer on the ITO thin film. The composition and the structure of this layer can be evaluated by the elemental analysis and the FT-IR method respectively. In addition, the wettability of the surface can be evaluated by determining the contact angle thereof with respect to a water drop.

The substrate is placed in an apparatus for vacuum vapor-deposition to form an organic vapor-deposited film. The deposition by the vacuum vapor-deposition method comprises introducing a hole-transport material, a luminous material and an electron-transport material (several grams each) into quartz boats (1 cc volume) wrapped in a heater coil (1ϕ; numbers of turns=5), heating one of the materials by passing an electric current (about 8 A) through the heater coil in vacuo to thus form a deposited film of the material on the substrate. On the other hand, if a plurality of thin films having different properties are laminated, an electric current is successively or intermittently passed through the heater coils wrapping the quartz boats in a predetermined order to deposit these materials in order. In addition, if a thin film of a mixture of different materials is deposited, an electric current is simultaneously passed through a plurality of quartz boats to co-deposit the materials while the mixing ratio of these materials are controlled by monitoring the vapor-deposition rates thereof. The degree of vacuum at this stage is in the order of $5 \times 10^{-5}$ (Torr). Thereafter, the glass substrate provided thereon with the organic thin film is suspended over a solution of an organic phosphorus atom-containing compound contained in a beaker while preventing any direct contact between the organic thin film and the solution. Then the phosphorus atom-containing compound is vaporized by application of heat to the beaker to form a layer thereof on the organic thin film. The formation of the layer is carried out while observing the color of the light reflected by the organic thin film. The composition and the structure of this layer can be evaluated by the elemental analysis and the FT-IR method respectively. Then a vapor-deposited film of a metal is partially formed on the layer, which is formed by the treatment with the phosphorus atom-containing compound, by placing the substrate in another vacuum vapor-deposition apparatus and depositing a metal, through a metal mask, by heating a metal source present in a tungsten boat at a degree of vacuum of $2 \times 10^{-6}$ (Torr).

The vapor-deposited substrate is withdrawn from the apparatus in the air, the positive terminal of a DC power source is connected to the ITO portion while the negative terminal thereof is communicated to the metal vapor-deposited film, then the voltage of the DC power source is gradually increased to determine the voltage, current and luminance of the emitted light by measuring instruments.

The present invention will hereinafter be explained in more detail with reference to the following non-limitative working Examples.

Example 1

An ITO film having a thickness of 1000Å was formed on a glass substrate to give a first electrode. Then an organic thin film of a fluorescent organic compound, i.e., 2,3,5,6-tetrakis(2-(4-methylphenyl)vinyl)pyrazine of 1000Å thickness was formed on the ITO film by the resistance heating vacuum vapor-deposition method. The resulting organic thin film was exposed to the vapor of triphenyl phosphite to give an interfacial layer formed through the treatment with an organic phosphorus atom-containing compound. The formation of the interfacial layer was visually confirmed by observing a color change of the light reflected by the organic thin film. An Al metal thin film serving as a second electrode was deposited on the interfacial layer by the resistance heating vacuum vapor-deposition method to thus give an EL element having a layer structure as shown in FIG. 1. When positive and negative terminals of a power source were connected to the ITO film and the Al film respectively and an electric voltage was applied thereto, there was observed an emission of a brilliant green light, at a voltage of 15V, which could be recognized even under the irradiation with lights from an indoor fluorescent lamp. The EL element was continuously operated at a predetermined current in the air. As a result, the element did not cause any change in the operating voltage and maintained steady light-emission. This clearly indicates that the EL element is quite stable.

Comparative Example 1

An EL element was produced in the same manner used in Example 1 except that the treatment with triphenylphosphite was omitted. When positive and negative terminals of a power source were connected to the ITO film and the Al film respectively and an electric voltage was applied thereto, there was observed an emission of a brilliant green light, at a voltage of 20V. This indicates that the driving voltage is 5V higher than that required for the EL element of Example 1. The EL element was continuously operated at a predetermined current in the air. As a result, there was observed an increase of the driving voltage and the formation of dark spots incapable of light-emission This indicates that the comparative EL element is quite unstable. Moreover, the adhesion strength of the metal thin film to the organic thin film was very low and the unevenness of the surface of the metal film was high to such an extent that the metal thin film lost its metallic luster, as compared with the EL element of Example 1 in which the interfacial layer was formed by treating the organic thin film with an organic phosphorus atom-containing compound.

Example 2

An ITO film having a thickness of 1000Å was formed on a glass substrate to give a first electrode. A hole-transport thin film of N,N'-diphenyl-N,N'-bis(3-methylphenyl)-1,1'-diphenyl-4,4'-diamine having a thickness of 500Å was formed on the ITO thin film by the resistance heating vacuum vapor-deposition method and then an organic thin film of a fluorescent organic compound, i.e., 2,3,5,6-tetrakis(2-(4-methylphenyl) vinyl)pyrazine of 500Å thickness was formed on the hole-transport thin film by the resistance heating vacuum vapor-deposition method to thus give an organic thin film having a two-layer structure. The resulting organic thin film was exposed to the vapor of triphenyl phosphite to give an interfacial layer formed through the treatment with an organic phosphorus atom-containing compound. The formation of the interfacial layer was visually confirmed by observing a color change of the light reflected by the organic thin film. An Al metal thin film serving as a second electrode was deposited on the interfacial layer by the resistance heating vacuum vapor-deposition method to thus give an EL element having a layer structure as shown in FIG. 2. When positive and negative terminals of a power source were connected to the ITO film and the Al film respectively and an electric voltage was applied thereto, there was observed an emission of a brilliant green light, at a voltage of 15V, which could be recognized even under the irradiation with lights from an indoor fluorescent lamp. The EL element was continuously operated at a predetermined current in the air. As a result, the element did not cause any change of the driving voltage and steadily emitted light. This clearly indicates that the EL element is quite stable.

Comparative Example 2

An EL element was produced in the same manner used in Example 2 except that the treatment with triphenyl phosphite was omitted. When positive and negative terminals of a power source were connected to the ITO film and the Al film respectively and an electric voltage was applied thereto, there was observed an emission of a brilliant green light, at a driving voltage of 20V. This indicates that the driving voltage is 5V higher than that required for the EL element of Example 2. The EL element was continuously operated at a predetermined current in the air. As a result, there was observed an increase of the driving voltage and the formation of dark spots incapable of light-emission. This indicates that the comparative EL element is quite unstable. Moreover, the adhesion strength of the metal thin film to the organic thin film was very low and the unevenness of the surface of the metal film was high to such an extent that the metal thin film lost its metallic luster, as compared with the EL element of Example 2 in which the interfacial layer was formed by treating the organic thin film with an organic phosphorus atom-containing compound.

Example 3

An ITO film having a thickness of 1000Å was formed on a glass substrate to give a first electrode. Then an organic thin film of a fluorescent organic compound, i.e., 2,3,5,6-tetrakis(2-(4-methylphenyl)vinyl)pyrazine of 1000Å thickness was formed on the ITO film by the resistance heating vacuum vapor-deposition method. The resulting organic thin film was exposed to the vapor of triphenyl phosphate to give an interfacial layer formed through the treatment with an organic phosphorus atom-containing compound. The formation of the interfacial layer was visually confirmed by observing a color change in the light reflected by the organic thin film. An Al metal thin film serving as a second electrode was deposited on the interfacial layer by the resistance heating vacuum vapor-deposition method to thus give an EL element having a layer structure as shown in FIG. 1. When positive and negative terminals of a power source were connected to the ITO film and the Al film respectively and an electric voltage was applied thereto, there was observed an emission of a brilliant green light, at a voltage of 15V, which could be recognized even under the irradiation with lights from an indoor fluorescent lamp. The EL element was continuously operated at a predetermined current in the air. As a result, the element did not cause any change of the driving voltage and steadily emitted light. This clearly indicates that the EL element is quite stable.

Comparative Example 3

An EL element was produced in the same manner used in Example 1 except that the treatment with triphenyl phosphate was omitted. When positive and negative terminals of a power source were connected to the ITO film and the Al film respectively and an electric voltage was applied thereto, there was observed an emission of a brilliant green light, at a voltage of 20V. This indicates that the driving voltage is 5V higher than that required for the EL element of Example 3. The EL element was continuously operated at a predetermined current in the air. As a result, there was observed an increase of the driving voltage and the formation of dark spots incapable of light-emission. This indicates that the comparative EL element is quite unstable. Moreover, the adhesion strength of the metal thin film to the organic thin film was very low and the unevenness of the surface of the metal film was high to such an extent that the metal thin film lost its metallic luster, as compared with the EL element of Example 3 in which the interfacial layer was formed by treating the organic thin film with an organic phosphorus atom-containing compound.

Example 4

An ITO film having a thickness of 1000Å was formed on a glass substrate to give a first electrode. Then an organic thin film of a fluorescent organic compound, i.e., 2,3,5,6-tetrakis(2-(4-methylphenyl)vinyl)pyrazine of 1000Å thickness was formed on the ITO film by the resistance heating vacuum vapor-deposition method. The resulting organic thin film was exposed to the vapor of tricresyl phosphate to give an interfacial layer formed through the treatment with an organic phosphorus atom-containing compound. The formation of the interfacial layer was visually confirmed by observing a color change of the light reflected by the organic thin film. An Al metal thin film serving as a second electrode was deposited on the interfacial layer by the resistance heating vacuum vapor-deposition method to thus give an EL element having a layer structure as shown in FIG. 1. When positive and negative terminals of a power source were connected to the ITO film and the Al film respectively and an electric voltage was applied thereto, there was observed an emission of a brilliant green light, at a voltage of 15V, which could be recognized even under the irradiation with lights from an indoor fluorescent lamp. The EL element was continuously operated at a predetermined current in the air. As a result, the element did not cause any change of the driving voltage and steadily emitted light. This clearly indicates that the EL element is quite stable.

Comparative Example 4

An EL element was produced in the same manner used in Example 4 except that the treatment with tricresyl phosphate was omitted. When positive and negative terminals of a power source were connected to the ITO film and the Al film respectively and an electric voltage was applied thereto, there was observed an emission of a brilliant green light, at a voltage of 20V. This indicates that the driving voltage is 5V higher than that required for the EL element of Example 4. The EL element was continuously operated at a predetermined current in the air. As a result, there was observed an increase of the driving voltage and the formation of dark spots incapable of light-emission. This indicates that the comparative EL element is quite unstable. Moreover, the adhesion strength of the metal thin film to the organic thin film was very low and the unevenness of the surface of the metal film was high to such an extent that the metal thin film lost its metallic luster, as compared with the EL element of Example 4 in which the interfacial layer was formed by treating the organic thin film with an organic phosphorus atom-containing compound.

As will be clear from the comparison of Examples 1 to 4 with Comparative Examples 1 to 4, the formation of an interfacial layer, between an organic thin film and a metal film, through a treatment of the organic thin film with an organic phosphorus atom-containing compound ensures (a) a decrease in the unevenness of the metal thin film formed on the organic thin film and (b) an increase of the adhesion strength of the metal film to the organic film. Furthermore, the formation of the interfacial layer ensures (c) the reduction of the driving voltage of the EL element, (d) the successive uniform light-emission during continuous operation and (e) prevention of any increase of the driving voltage during continuous operation and thus the operational properties of the EL element can be substantially stabilized.

Example 5

An ITO film having a thickness of 1000Å was formed on a glass substrate to give a transparent conductive inorganic thin film. An alcohol solution of vinyltrimethoxysilane was applied onto the ITO film and dried at 120° in the air to give an interfacial layer formed through the treatment with a silane-coupling agent on the conductive inorganic thin film. A hole-transport thin film of N,N'-diphenyl-N,N'-bis(3-methylphenyl)-1,1'-diphenyl-4,4'-diamine of 600Å thickness was formed on the interfacial layer by the resistance heating vacuum vapor-deposition method and a luminous thin film of tris-(8-hydroxyquinolinol)aluminum having a thickness of 600Å was formed on the hole-transport thin film by the resistance heating vacuum vapor-deposition method to thus give an organic thin film having a two-layer structure. An Mg metal thin film serving as a second electrode was deposited on the organic thin film by the resistance heating vacuum vapor-deposition method to thus give an EL element having a layer structure as shown in FIG. 3. In this respect, the area of the Mg metal deposit film was 1 cm square.

When positive and negative terminals of a power source were connected to the ITO film and the Mg film respectively and an electric voltage was applied thereto, there was observed an emission of a brilliant green light, at a voltage of 10V or higher, which could be recognized even under the irradiation with lights from an indoor fluorescent lamp. The luminance thereof was 1600 cd/m$^2$ at an applied DC voltage of 16V and a current density of 100 mA/cm$^2$. Moreover, it was observed that the element could be continuously operated for a long period of time over 5000 hours at 100 cd/m$^2$. Thus, it was confirmed that the EL element was stable and emitted lights of high luminance.

Comparative Example 5

An EL element was produced in the same manner used in Example 5 except that the treatment with the alcohol solution of vinyl-trimethoxysilane was omitted.

The luminance thereof was 1000 cd/m$^2$ at an applied DC voltage of 16V and a current density of 100 mA/cm$^2$. In other words, the efficiency thereof was substantially lowered as compared with the EL element of Example 5. It was also found that the comparative EL element was greatly deteriorated since the luminance thereof was substantially reduced 10 hours after the initiation of continuous operation at 100 cd/m$^2$.

Example 6

An EL element was produced in the same manner used in Example 5 except that N-$\beta$-(aminoethyl)-$\gamma$-aminopropyltrimethoxysilane was substituted for the vinyltrimethoxysilane used in Example 5.

When positive and negative terminals of a power source were connected to the ITO film and the Mg film respectively and an electric voltage was applied thereto, there was observed an emission of a brilliant green light, at a voltage of 10V or higher, which could be recognized even under the irradiation with lights from an indoor fluorescent lamp.

The luminance thereof was 1300 cd/m$^2$ at an applied DC voltage of 16V and a current density of 100 mA/cm$^2$. Moreover, it was observed that the element could be continuously operated for a long period of time over 5000 hours at 100 cd/m$^2$. Thus, it was confirmed that the EL element was stable and emitted lights of high luminance.

Comparative Example 6

An EL element was produced in the same manner used in Example 5 except that the treatment with N-$\beta$-(aminoethyl)-$\gamma$-aminopropyltrimethoxysilane was omitted.

The luminance thereof was 1000 cd/m$^2$ at an applied DC voltage of 16V and a current density of 100 mA/cm$^2$. In other words, the efficiency thereof was substantially lowered as compared with the EL element of Example 6. It was also found that the comparative EL element was greatly deteriorated since the luminance thereof was substantially reduced 10 hours after the initiation of continuous operation at 100 cd/m$^2$.

Example 7

An EL element was produced in the same manner used in Example 5 except that γ-methacryloxypropyltrimethoxysilane was substituted for the vinyltrimethoxysilane used in Example 5.

When positive and negative terminals of a power source were connected to the ITO film and the Mg film respectively and an electric voltage was applied thereto, there was observed an emission of a brilliant green light, at a voltage of 10V or higher, which could be recognized even under the irradiation with lights from an indoor fluorescent lamp.

The luminance thereof was 1200 cd/m$^2$ at an applied DC voltage of 16V and a current density of 100 mA/cm$^2$. Moreover, it was observed that the element could be continuously operated for a long period of time over 5000 hours at 100 cd/m$^2$. Thus, it was confirmed that the EL element was stable and emitted lights of high luminance.

Comparative Example 7

An EL element was produced in the same manner used in Example 7 except that the treatment with γ-methacryloxypropyltrimethoxysilane was omitted.

The luminance thereof was 1000 cd/m$^2$ at an applied DC voltage of 16V and a current density of 100 mA/cm$^2$. In other words, the efficiency thereof was substantially lowered as compared with the EL element of Example 6. It was also found that the comparative EL element was greatly deteriorated since the luminance thereof was substantially reduced 10 hours after the initiation of continuous operation at 100 cd/m$^2$.

Example 8

An ITO film having a thickness of 1000Å was formed on a glass substrate to give a transparent conductive inorganic thin film. A hydrogenated microcrystalline Si film having a thickness of 200Å was formed on the transparent conductive inorganic thin film by the plasma CVD method to thus give an inorganic semiconductor thin film. An alcohol solution of vinyltrimethoxysilane was applied onto the inorganic semiconductor film and dried at 120° C. in the air to give an interfacial layer formed through the treatment with a silane-coupling agent on the semiconductor thin film. An organic thin film of tris-(8-hydroxyquinolinol)aluminum having a thickness of 600Å was formed on the interfacial layer by the resistance heating vacuum vapor-deposition method. Then an Mg metal thin film serving as a second electrode was deposited on the organic thin film by the resistance heating vacuum vapor-deposition method to thus give an EL element having a layer structure as shown in FIG. 4. In this respect, the area of the Mg metal deposit film was 1 cm square.

When positive and negative terminals of a power source were connected to the ITO film and the Mg film respectively and an electric voltage was applied thereto, there was observed an emission of a brilliant green light, at a voltage of 10V or higher, which could be recognized even under the irradiation with lights from an indoor fluorescent lamp. The luminance current density of 100 mA/cm$^2$. Moreover, it was observed that the element could be continuously operated for a long period of time over 10000 hours at 100 cd/m$^2$. Thus, it was confirmed that the EL element was stable and emitted lights of high luminance.

Comparative Example 8

An EL element was produced in the same manner used in Example 8 except that the treatment with the alcohol solution of vinyl-trimethoxysilane was omitted.

The luminance thereof was 1500 cd/m$^2$ at an applied DC voltage of 15V and a current density of 100 mA/cm$^2$. In other words, the efficiency thereof was substantially lowered as compared with the EL element of Example 8. It was also found that the comparative EL element was greatly deteriorated since the luminance thereof was substantially reduced 10 hours after the initiation of continuous operation at 100 cd/m$^2$.

As will be clear from the comparison of Examples 5 to 8 with Comparative Examples 5 to 8, the treatment of an inorganic thin film with a silane-coupling agent, in the EL element which makes use of an organic thin film, ensures the substantial improvement of light-emission efficiency and resistance to deterioration and permits the formation of an EL element capable of being operated for a long time period.

Example 9

An ITO film having a thickness of 1000Å was formed on a glass substrate to give a transparent conductive inorganic thin film. An alcohol solution of vinyltrimethoxysilane was applied onto the ITO film and dried at 120° in the air to give an interfacial layer formed through the treatment with a silanecoupling agent on the ITO thin film. A hole-transport thin film of N,N'-diphenyl-N,N'-bis-(3-methylphenyl)-1,1'-diphenyl-4,4'-diamine having a thickness of 600 Å was formed on the interfacial layer by the resistance heating vacuum vapor-deposition method and an organic thin film of tris-(8-hydroxyquinolinol)aluminum having a thickness of 600Å was formed on the hole-transport thin film by the resistance heating vacuum vapor-deposition method to give an organic thin film having a two-layer structure. The organic thin film was exposed to the vapor of triphenyl phosphite to give an interfacial layer formed through the treatment with an organic phosphorus atom-containing compound on the organic thin film. The formation of the interfacial layer was visually confirmed by observing the color change of the light reflected by the organic thin film. Then an Mg metal thin film serving as a second electrode was deposited on the interfacial layer by the resistance heating vacuum vapor-deposition method to thus give an EL element having a layer structure as shown in FIG. 5. In this respect, the area of the Mg metal deposit film was 1 cm square.

When positive and negative terminals of a power source were connected to the ITO film and the Mg film respectively and an electric voltage was applied thereto, there was observed an emission of a brilliant green light, at a voltage of 10V or higher, which could be recognized even under the irradiation with lights from an indoor fluorescent lamp. The luminance thereof was 2100 cd/m$^2$ at an applied DC voltage of 12V and a current density of 100 mA/cm$^2$. Moreover, it was observed that the element could be continuously operated for a long period of time over 8000 hours at 100 cd/m$^2$. Thus, it was confirmed that the EL element was stable and emitted lights of high luminance.

Comparative Example 9

An EL element was produced in the same manner used in Example 9 except that the treatment with the alcohol solution of vinyl-trimethoxysilane was omitted.

The luminance thereof was 1000 cd/m² at an applied DC u voltage of 16V and a current density of 100 mA/cm². In other words, the efficiency thereof was substantially lowered as compared with the EL element of Example 9. It was also found that the comparative EL element was greatly deteriorated since the luminance thereof was substantially reduced 10 hours after the initiation of continuous operation at 100 cd/m².

Example 10

An ITO film having a thickness of 1000Å was formed on a glass substrate to give a transparent conductive inorganic thin film. A hydrogenated microcrystalline Si film having a thickness of 200Å was formed on the transparent conductive inorganic thin film by the plasma CVD method to thus give an inorganic semiconductor thin film. An alcohol solution of vinyltrimethoxysilane was applied onto the inorganic semiconductor thin film and dried at 120° in the air to give an interfacial layer formed through the treatment with a silane-coupling agent on the semiconductor thin film. An organic thin film of tris-(8-hydroxyquinolinol)aluminum having a thickness of 600Å was formed on the interfacial layer by the resistance heating vacuum vapor-deposition method. The organic thin film was exposed to the vapor of triphenyl phosphite to give an interfacial layer formed through the treatment with an organic phosphorus atom-containing compound on the organic thin film. The formation of the interfacial layer was visually confirmed by observing the color change of the light reflected by the organic thin film. Then an Mg metal thin film serving as a second electrode was deposited on the interfacial layer by the resistance heating vacuum vapor-deposition method to thus give an EL element having a layer structure as shown in FIG. 6. In this respect, the area of the Mg metal deposit film was 1 cm square.

When positive and negative terminals of a power source were connected to the ITO film and the Mq film respectively and an electric voltage was applied thereto, there was observed an emission of a brilliant green light, at a voltage of 10V or higher, which could be recognized even under the irradiation with lights from an indoor fluorescent lamp. The luminance thereof was 4100 cd/m² at an applied DC voltage of 11V and a current density of 100 mA/cm². Moreover, it was observed that the element could be continuously operated for a long period of time over 15000 hours at 100 cd/m². Thus, it was confirmed that the EL element was stable and emitted lights of high luminance.

Comparative Example 10

An EL element was produced in the same manner used in Example 10 except that the treatment with the alcohol solution of vinyl-trimethoxysilane and the treatment with triphenyl phosphite were omitted.

The luminance thereof was 1500 cd/m² at an applied DC voltage of 15V and a current density of 100 mA/cm². In other words, the efficiency thereof was substantially lowered as compared with the EL element of Example 10. It was also found that the comparative EL element was greatly deteriorated since the luminance thereof was substantially reduced 10 hours after the initiation of continuous operation at 100 cd/m².

As will be clear from the comparison of Examples 9 and 10 with Comparative Examples 9 and 10, the treatment of the inorganic thin film with a silane-coupling agent and the formation of the interfacial layer between the organic thin film and the metal thin film through the treatment with an organic phosphorus atom-containing compound, in the EL element which makes use of an organic thin film, ensure the substantial improvement of light-emission efficiency and resistance to deterioration and permit the formation of an EL element capable of being operated for a long time period.

We claim:

1. An organic thin film EL element having a layer structure which comprises at least one organic thin film sandwiched between two electrodes, at least one of which is a metal thin film, and an interfacial layer of a phosphorous atom-containing compound formed between the organic thin film and the metal thin film adjacent to the organic thin film, which layer is produced by applying or exposing at least one of the interfacial surfaces of the organic thin film and the metal thin film with a reactive organic phosphorous atom-containing compound.

2. The organic thin film EL element according to claim 1 wherein one of the electrodes comprises a metal thin film and the other electrode comprises a transparent conductive inorganic thin film.

3. The organic thin film EL element according to claim 1 wherein the organic thin film comprises two layers, one of which is a luminous organic thin film and the other of which is a hole-transport organic thin film.

4. The organic thin film EL element according to claim 1 wherein the organic phosphorus atom-containing compound is a member selected from the group consisting of phosphoric acid esters, acidic phosphoric acid esters, phosphorous acid esters and organic phosphines.

5. The organic thin film EL element according to claim 1 wherein the thickness of the interfacial layer ranges from the thickness of a monomolecular layer to 100Å.

6. An organic thin film EL element having a layer structure which comprises at least one organic thin film sandwiched between two electrodes, at least one of which is a metal thin film and the other of which is an inorganic thin film, and an interfacial layer of a phosphorous atom-containing compound formed between the organic thin film and the inorganic thin film adjacent to the organic thin film, which layer is formed by coating, applying or exposing at least one of the interfacial surfaces of the organic thin film and the inorganic thin film with a silanecoupling agent.

7. The organic thin film EL element according to claim 6 wherein the inorganic thin film adjacent to the organic thin film is a transparent conductive inorganic thin film.

8. The organic thin film EL element according to claim 6 wherein the inorganic thin film adjacent to the organic thin film is an inorganic semiconductor thin film.

9. The organic thin film EL element according to claim 6 wherein the silane-coupling agent is a compound represented by the following general formula (1):

$$X-Si(OR)_3 \qquad (1)$$

wherein X is an amino, vinyl, epoxy or mercapto group or a halogen atom; and R is a methyl or ethyl group.

10. The organic thin film EL element according to claim 6 wherein the thickness of the interfacial layer ranges from the thickness of a monomolecular layer to 100Å.

11. An organic thin film EL element having a layer structure which comprises at least one organic thin film sandwiched between two electrodes, one of which is a metal thin film and the other of which is a transparent conductive inorganic thin film, a first interfacial layer of a phosphorous atom-containing compound formed between the organic thin film and the metal thin film adjacent to the organic thin film, which layer is formed by coating, applying or exposing at least one of the interfacial surfaces of the organic thin film and the interfacial surfaces of the metal thin film with an organic phosphorous atom-containing compound and a second interfacial layer of a phosphorous atom-containing compound formed between the organic thin film and the inorganic thin film adjacent to the organic thin film, which second layer is formed by coating, applying or exposing at least one of the interfacial surface of the organic thin film and the interfacial surface of the inorganic thin film with a silane-coupling agent.

12. The organic thin film EL element according to claim 11 wherein one of the electrodes comprises a metal thin film and the other electrode comprises a transparent conductive inorganic thin film.

13. The organic thin film EL element according to claim 11 wherein the organic thin film comprises two layers, one of which is a luminous organic thin film and the other of which is a hole-transport organic thin film.

14. The organic thin film EL element according to claim 11 wherein the organic phosphorus atom-containing compound is a member selected from the group consisting of phosphoric acid esters, acidic phosphoric acid esters, phosphorous acid esters and organic phosphines.

15. The organic thin film EL element according to claim 11 wherein the inorganic thin film adjacent to the organic thin film is a transparent conductive inorganic thin film.

16. The organic thin film EL element according to claim 11 wherein the inorganic thin film adjacent to the organic thin film is an inorganic semiconductor thin film.

17. The organic thin film EL element according to claim 11 wherein the silane-coupling agent is a compound represented by the following general formula (1):

$$X-Si(OR)_3 \qquad (1)$$

wherein X is an amino, vinyl, epoxy or mercapto group or a halogen atom; and R is a methyl or ethyl group.

18. The organic thin film EL element according to claim 11 wherein the thickness of the interfacial layer ranges from the thickness of a monomolecular layer to 100Å.

* * * * *